(12) United States Patent
Samachisa

(10) Patent No.: US 6,980,471 B1
(45) Date of Patent: Dec. 27, 2005

(54) SUBSTRATE ELECTRON INJECTION TECHNIQUES FOR PROGRAMMING NON-VOLATILE CHARGE STORAGE MEMORY CELLS

(75) Inventor: George Samachisa, San Jose, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 11/021,193

(22) Filed: Dec. 23, 2004

(51) Int. Cl.[7] .............................................. G11C 16/12
(52) U.S. Cl. ........................ 365/185.02; 365/185.27; 365/185.18; 365/185.17; 365/185.19; 365/185.26; 365/185.28
(58) Field of Search ...................... 365/185.27, 185.18, 365/185.17, 185.02, 185.19, 185.26, 185.12, 365/185.28

(56) References Cited

U.S. PATENT DOCUMENTS

| | | | |
|---|---|---|---|
| 4,622,656 A | 11/1986 | Kamiya et al. ......... | 365/185.15 |
| 5,043,940 A | 8/1991 | Harari ................... | 365/185.03 |
| 5,070,032 A | 12/1991 | Yuan et al. ............. | 438/267 |
| 5,095,344 A | 3/1992 | Harari ................... | 257/328 |
| 5,172,338 A | 12/1992 | Mehrotra et al. ....... | 365/185.03 |
| 5,216,269 A | 6/1993 | Middelhoek et al. ... | 257/318 |
| 5,313,421 A | 5/1994 | Guterman et al. ..... | 365/185.15 |
| 5,315,541 A | 5/1994 | Harari et al. .......... | 365/185.13 |
| 5,343,063 A | 8/1994 | Yuan et al. ............. | 257/317 |
| 5,570,315 A | 10/1996 | Tanaka et al. ......... | 365/185.22 |
| 5,661,053 A | 8/1997 | Yuan .................... | 438/257 |
| 5,703,808 A * | 12/1997 | Makwana et al. ..... | 365/185.27 |
| 5,774,397 A | 6/1998 | Endoh et al. .......... | 365/185.19 |
| 5,886,928 A * | 3/1999 | Makwana et al. ..... | 365/185.27 |
| 5,978,269 A * | 11/1999 | Bergemont et al. ... | 365/185.19 |
| 6,046,935 A | 4/2000 | Takeuchi et al. ...... | 365/185.03 |
| 6,090,666 A | 7/2000 | Ueda et al. ............ | 438/257 |
| 6,188,604 B1 * | 2/2001 | Liu et al. ............... | 365/185.11 |
| 6,281,075 B1 | 8/2001 | Yuan et al. ............. | 438/257 |
| 6,373,746 B1 | 4/2002 | Takeuchi et al. ...... | 365/185.03 |
| 6,456,528 B1 | 9/2002 | Chen .................... | 365/185.03 |
| 6,522,580 B2 | 2/2003 | Chen et al. ............ | 365/185.02 |
| 6,656,792 B2 | 12/2003 | Choi et al. ............. | 438/257 |
| 6,771,536 B2 | 8/2004 | Li et al. ................. | 365/185.02 |
| 6,781,877 B2 | 8/2004 | Cernea et al. ......... | 365/185.03 |
| 2003/0109093 A1 | 6/2003 | Harari et al. .......... | 438/200 |
| 2003/0147278 A1 | 8/2003 | Tanaka et al. ......... | 365/185.03 |
| 2004/0057283 A1 | 3/2004 | Cernea ................. | 365/185.11 |
| 2004/0130941 A1 | 7/2004 | Kan et al. .............. | 365/177 |

OTHER PUBLICATIONS

Edited by Brown and Brewer, "*Nonvolatile Semicondictor Memory Technology*," IEEE Press, Section 1.2, 1998, pp. 9-25.

Kamiya et al., "EPROM Cell with High Gate Injection Efficiency," IEDM Technical Digest, 1982, pp. 741-744.

Ogura et al., "Low Voltage, Low Current, High Speed Program Step Split Gate Cell with Ballistic Direct Injection for EEPROM/Flash", IEDM 1998, pp. 987-990.

(Continued)

*Primary Examiner*—Andrew Q. Tran
(74) *Attorney, Agent, or Firm*—Parsons Hsue & de Runtz LLP

(57) ABSTRACT

A programming technique for a flash memory causes electrons to be injected from the substrate into charge storage elements of the memory cells. The source and drain regions of memory cells along a common word line or other common control gate line being programmed by a voltage applied to the common line are caused to electrically float while the source and drain regions of memory cells not being programmed have voltages applied thereto. This programming technique is applied to large arrays of memory cells having either a NOR or a NAND architecture.

11 Claims, 8 Drawing Sheets

Memory Cell A
(Programming)

Memory Cell B
(Programming Inhibited)

OTHER PUBLICATIONS

Eitan et al., "Substrate Hot-Electron Injection EPROM," *IEEE Transactions on Electron Devices*, vol. ED-31, No. 7, Jul. 1984, pp. 934-942.

Wijburg et al., "VIPMOS—A Novel Buried Injector Structure for EPROM Applications," *IEEE Transactions on Electron Devices*, vol. 38, No. 1, Jan. 1991, pp. 111-120.

* cited by examiner

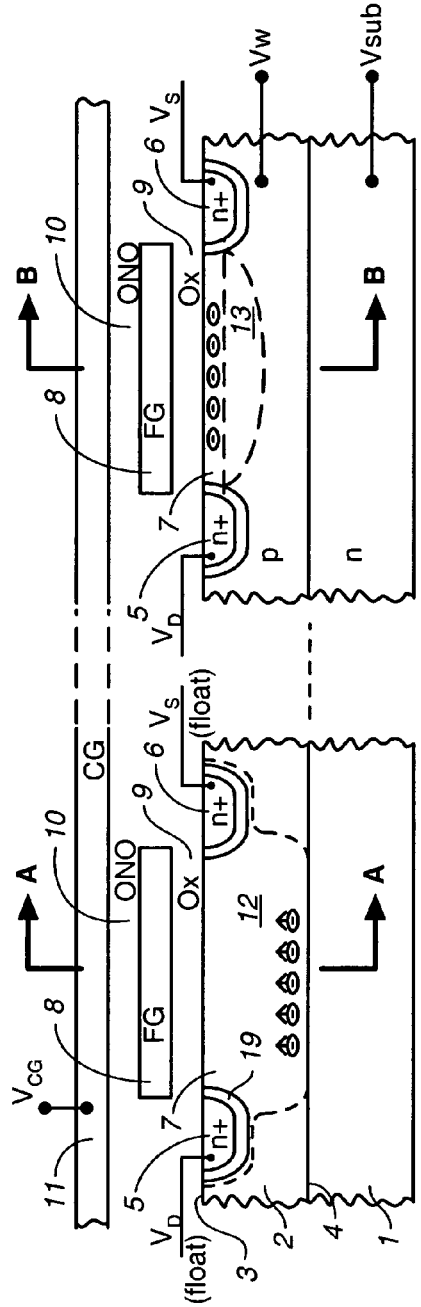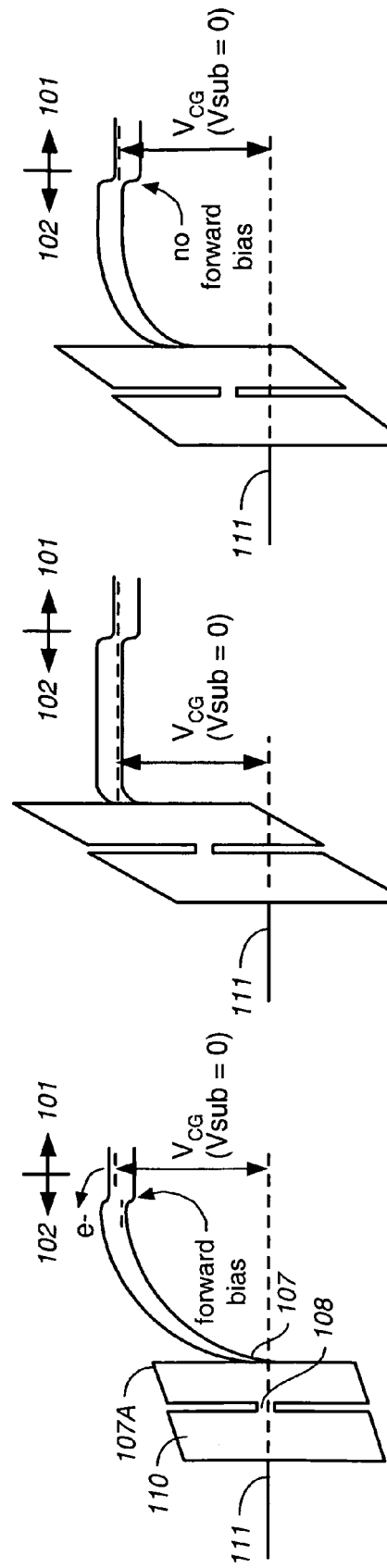

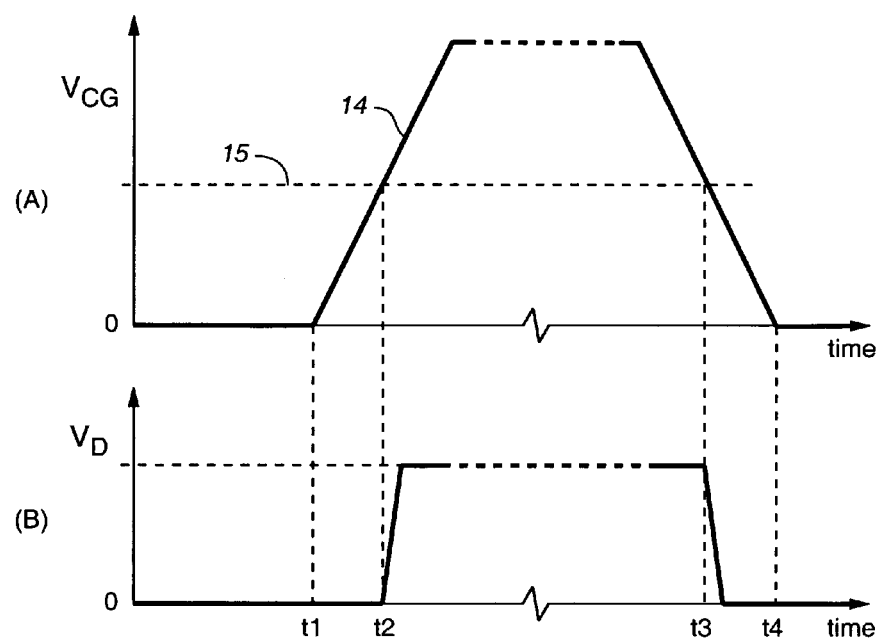
FIG._4

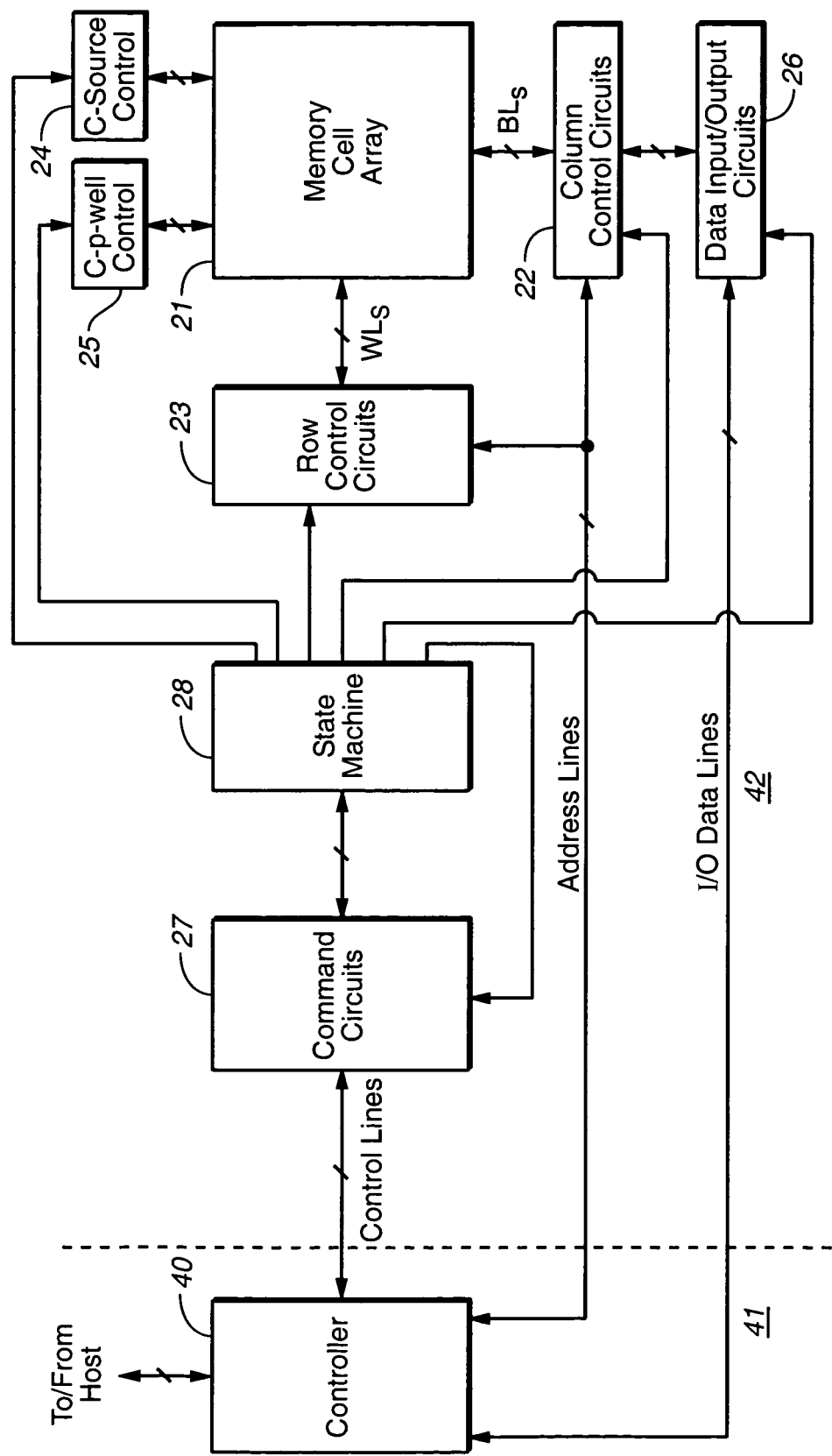
*FIG._5*

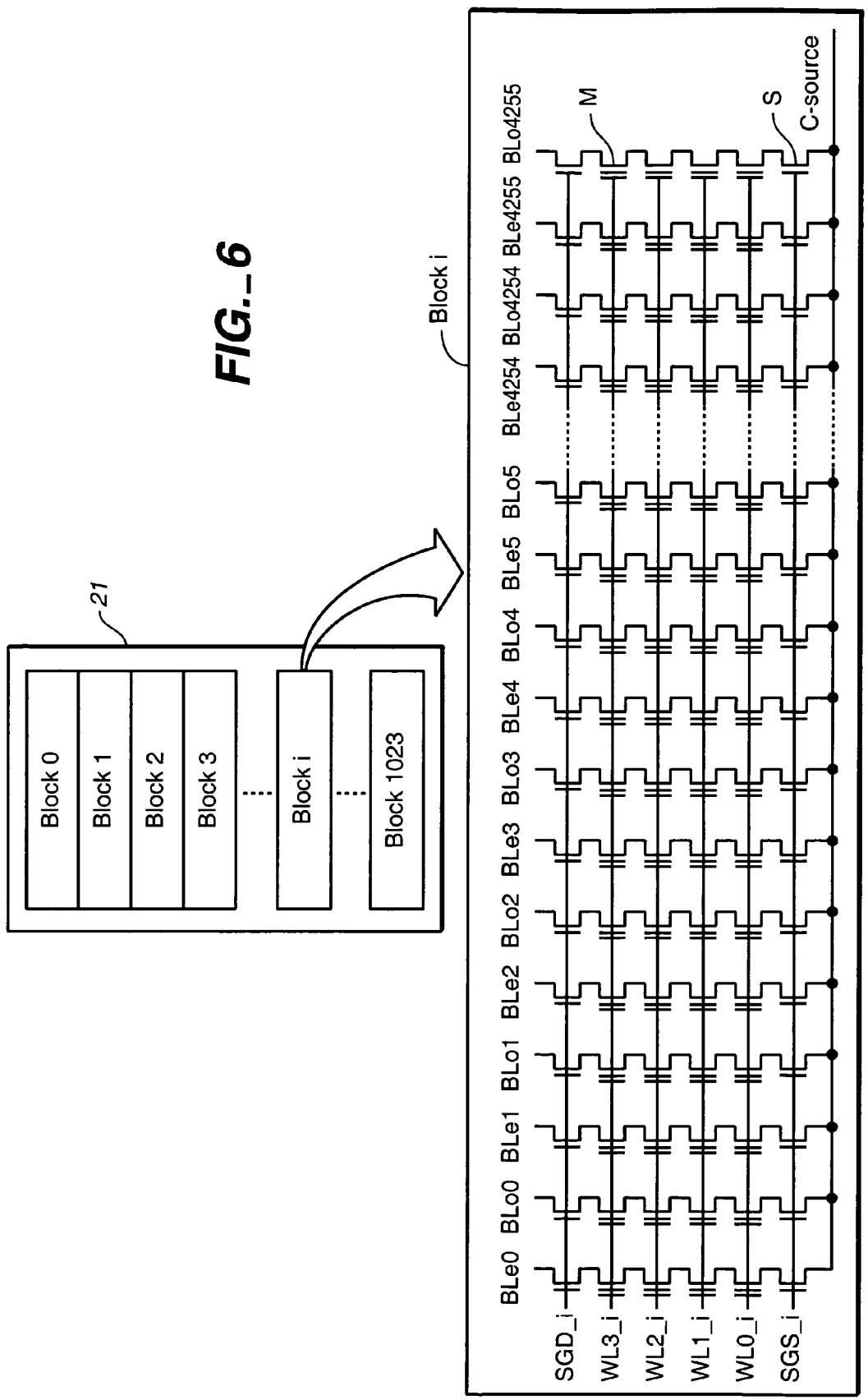
FIG._6

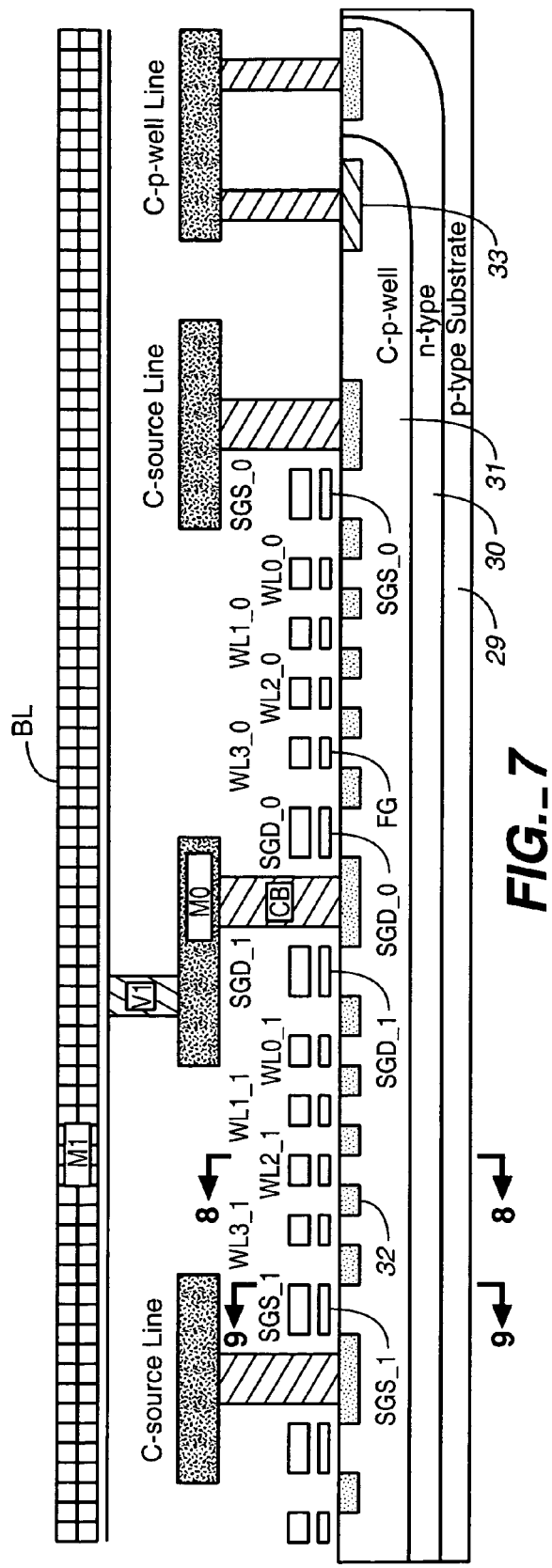
FIG._7

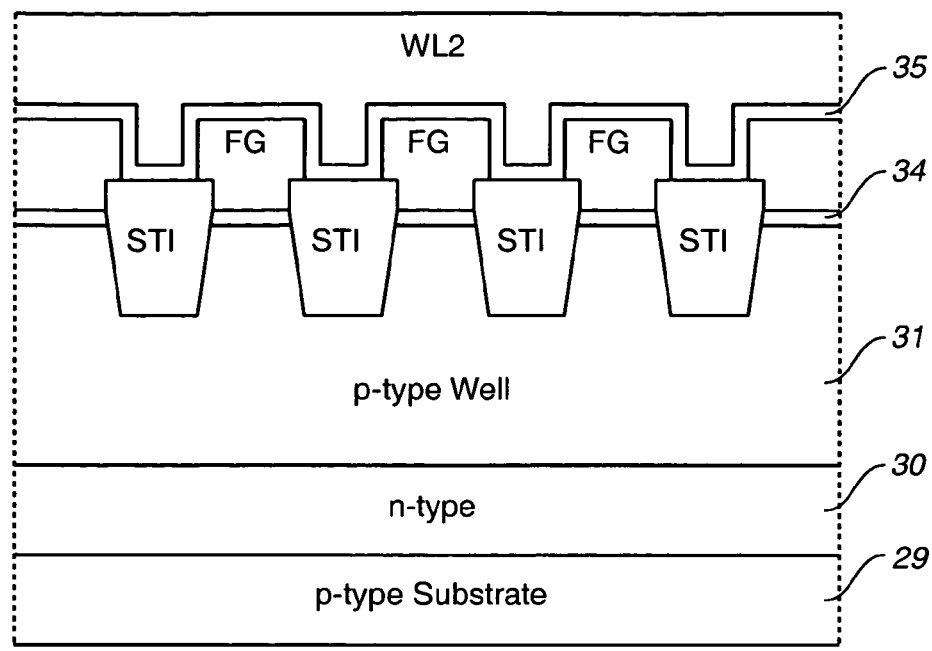
FIG._8
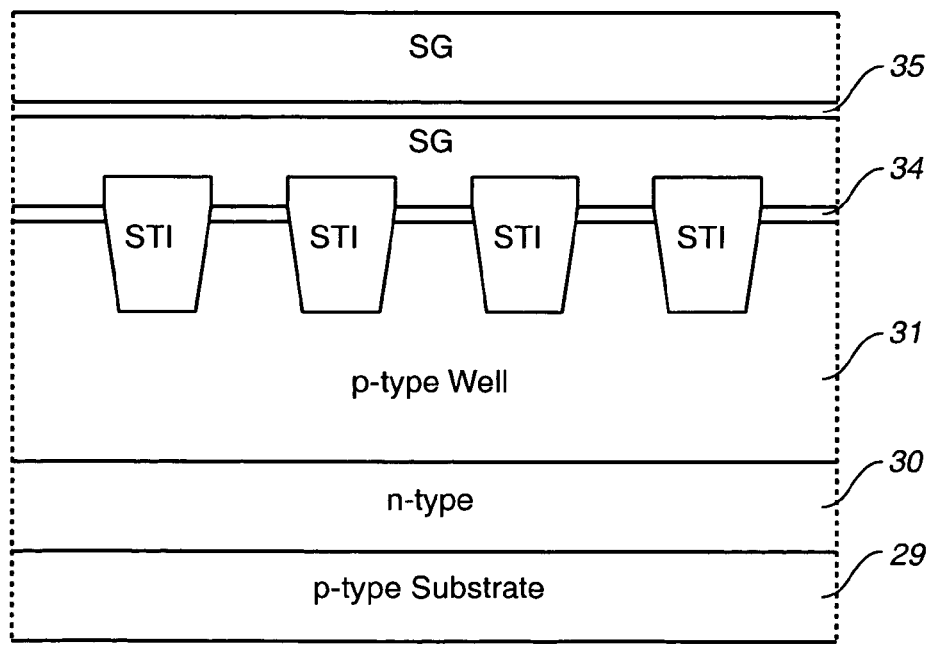
FIG._9

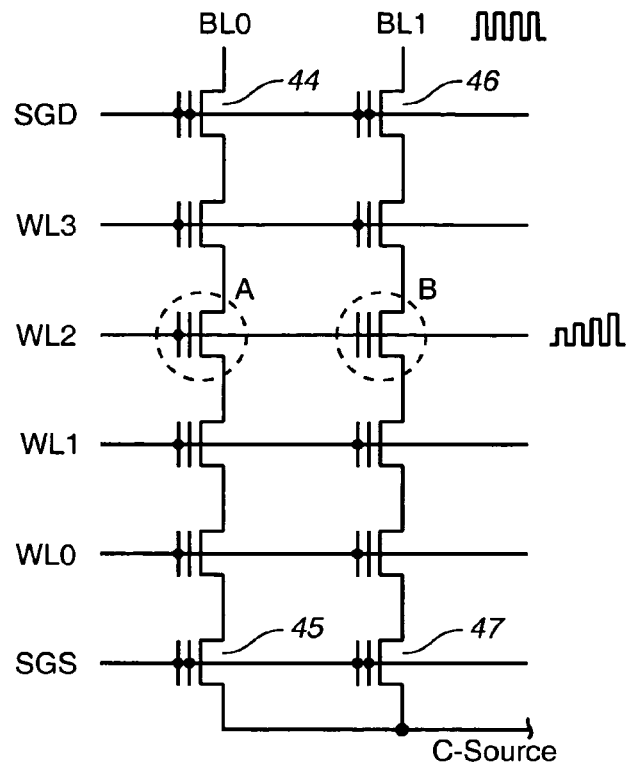
FIG._10
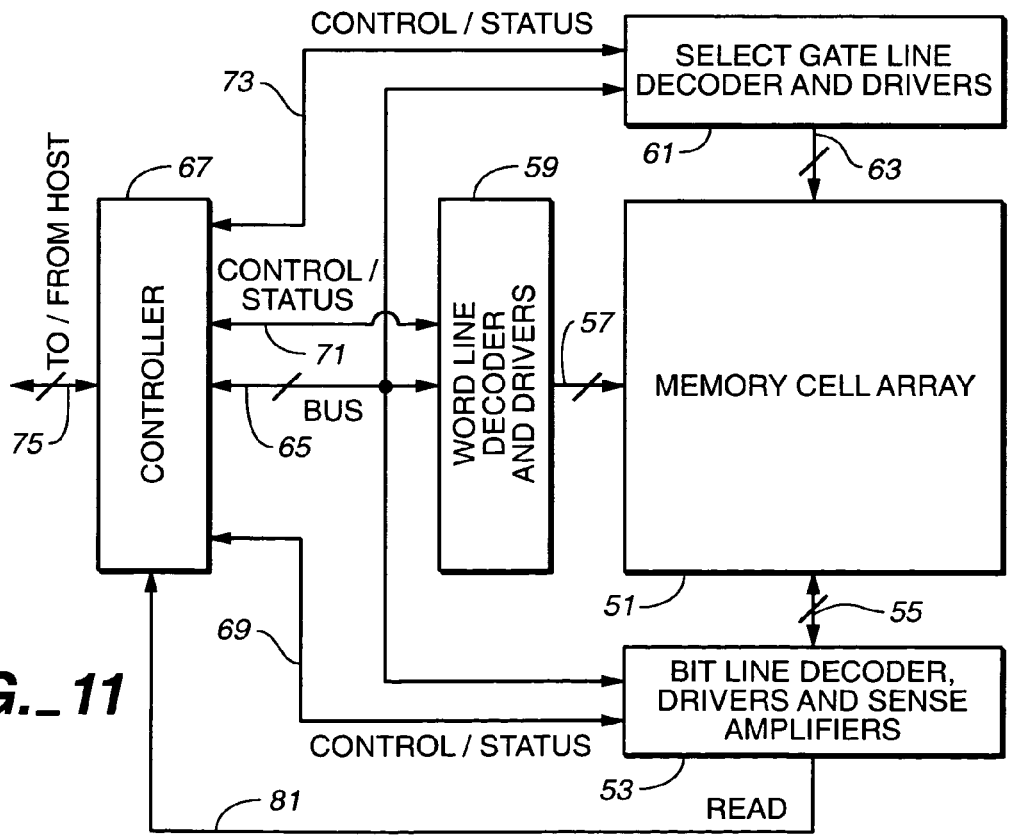
FIG._11

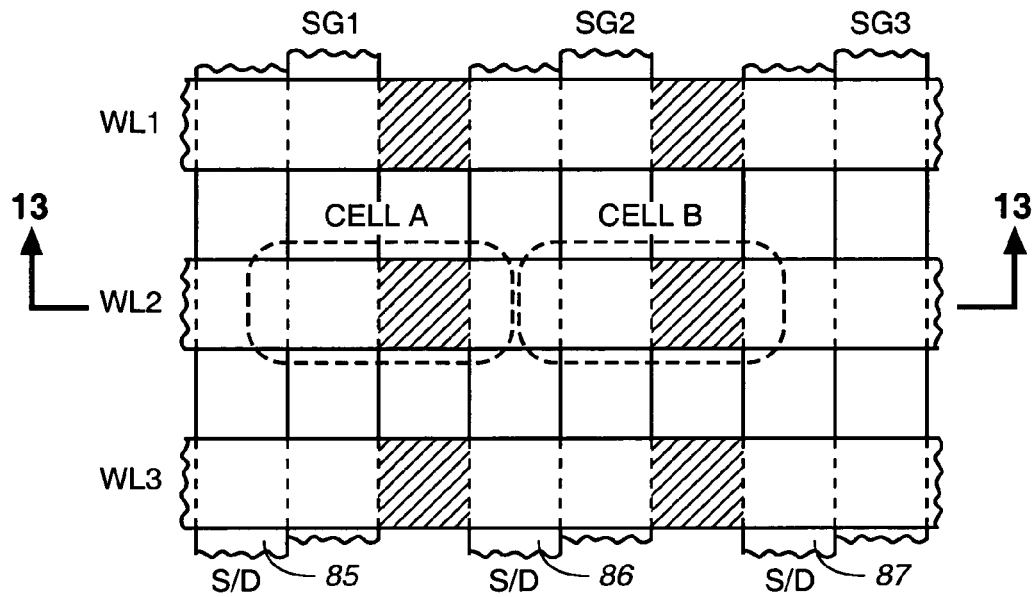
FIG._12
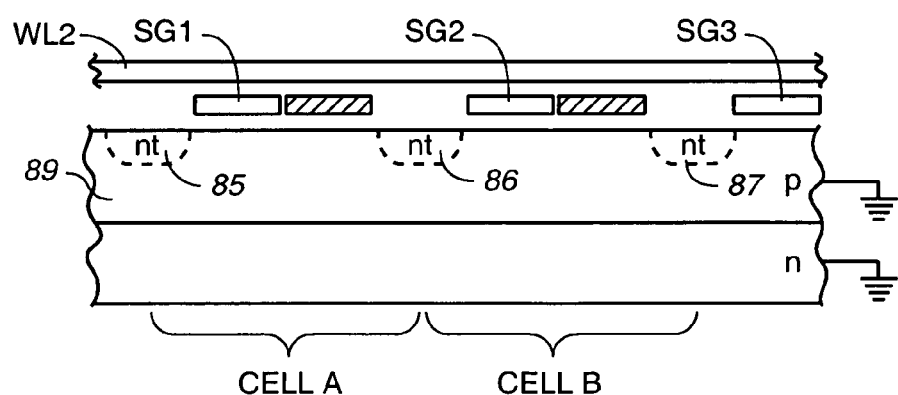
FIG._13

SUBSTRATE ELECTRON INJECTION TECHNIQUES FOR PROGRAMMING NON-VOLATILE CHARGE STORAGE MEMORY CELLS

BACKGROUND

This relates to the structure and operation of re-programmable non-volatile memories, particularly to the programming of flash semiconductor memory cells by an improved substrate hot electron injection technique. All patents, patent applications, articles and other publications, documents and things referenced herein are hereby incorporated herein by this reference in their entirety for all purposes.

There are many commercially successful non-volatile memory products being used today, particularly in the form of small memory cards and flash memory drives. Individual memory cells of an array are formed on a semiconductor wafer with conductive floating gates, most commonly made of doped polysilicon material, on which an electron charge is stored to a level according to the data being stored in the cell. The floating gate is positioned over at least a portion of a channel between source and drain regions, with a gate dielectric between the floating gate and the substrate. The threshold voltage of the memory cell is controlled by the amount of charge on the floating gate.

There are two classes of memory cell arrays that are currently the most common, NOR and NAND, which differ primarily in the manner in which the memory cells are connected together. In a NOR array, drain connections of the individual cells are connected together in parallel to common bit lines. Examples of NOR memory cell arrays, their uses in memory systems and methods of manufacturing them are given in U.S. Pat. Nos. 5,070,032, 5,095,344, 5,315,541, 5,343,063, and 5,661,053, and 6,281,075.

In the NAND configuration, eight, sixteen or more memory cells are connected in series with each other in strings that are selectively connected between individual bit lines and a common potential by select transistors at each end of the strings. Word lines extend across memory cells of multiple strings. Examples of NAND flash memory cell arrays and their operation as part of a memory system may be had by reference to U.S. Pat. Nos. 5,570,315, 5,774,397, 6,046,935, 6,373,746, 6,456,528, 6,522,580, 6,771,536 and 6,781,877 and U.S. patent application publication no. 2003/0147278A1.

There are various programming techniques for causing electrons from the substrate to travel through the gate dielectric and onto the floating gate. The most common programming mechanisms are described in a book edited by Brown and Brewer, "Nonvolatile Semiconductor Memory Technology," IEEE Press, section 1.2, pages 9–25 (1998). One technique, termed "Fowler-Nordheim tunneling". (section 1.2.1), causes electrons to tunnel through the floating gate dielectric under the influence of a high field that is established thereacross by a voltage difference between the control gate and the substrate channel. Another technique, channel hot electron injection in the drain region, commonly referred to as "hot-electron injection" (section 1.2.3), injects electrons from the cell's channel into a region of the floating gate adjacent the cell's drain. Yet another technique, termed "source side injection" (section 1.2.4), controls the substrate surface electrical potential along the length of the memory cell channel in a manner to create conditions for electron injection in a region of the channel away from the drain. Source side injection is also described in an article by Kamiya et al., "EPROM Cell with High Gate Injection Efficiency," IEDM Technical Digest, 1982, pages 741–744, and in U.S. Pat. Nos. 4,622,656 and 5,313,421. In a further programming technique, termed "ballistic injection", high fields are generated within a short channel to accelerate electrons directly onto the charge storage element, as described by Ogura et al., "Low Voltage, Low Current, High Speed Program Step Split Gate Cell with Ballistic Direct Injection for EEPROM/Flash", IEDM 1998, pages 987–990.

Yet another programming technique, termed "substrate hot electron injection," causes electrons that enter a depletion region under the channel to be accelerated by an electric field to the substrate surface and then through the gate dielectric to the floating gate. An early description of this programming mechanism is found in an article by Eitan et al., "Substrate Hot-Electron Injection EPROM," *IEEE Transactions on Electron Devices*, vol. ED-31, no. 7, pp. 934–942 (July 1984). Many different techniques have been proposed for the generation of enough electrons in the substrate for efficient programming. Eitan et al. add a bipolar device on the surface of the substrate adjacent an electrically programmable read-only-memory (EPROM) cell being programmed. Another approach is to form a buried injector in the substrate under the channel of the memory cell that emits electrons into the depletion layer when its p-n junction is subjected to punchthrough conditions. See, for example, Wijburg et al., "VIPMOS—A Novel Buried Injector Structure for EPROM Applications," *IEEE Transactions on Electron Devices*, vol. 38, no. 1, pp. 111–120 (January 1991), and U.S. Pat. No. 5,216,269.

There are two common erase techniques that remove charge from floating gates of flash electrically erasable and programmable read-only-memory (EEPROM) cells. One is to erase floating gates to the substrate by applying appropriate voltages to the source, drain, substrate and other gate(s) that cause electrons to tunnel through a portion of a dielectric layer between the floating gate and the substrate. The other erase technique transfers electrons from the floating gate to another gate through a thin tunnel dielectric layer positioned between them.

It is continuously desired to increase the amount of digital data that can be stored in a given area of a silicon substrate, in order to increase the storage capacity of a given size memory card and other types packages, or to both increase capacity and decrease size. One way to increase the storage density of data is to store more than one bit of data per memory cell floating gate. This is accomplished by dividing a window of charge storage into more than two levels or ranges. The use of four such states allows each cell to store two bits of data, a cell with sixteen states stores four bits of data, and so on. Multiple state flash EEPROM structures and their operation are described in U.S. Pat. Nos. 5,043,940, 5,172,338 and aforementioned no. 6,522,580, as examples.

Another type of memory cell useful in flash EEPROM systems utilizes a non-conductive dielectric material in place of a conductive floating gate to store charge in a non-volatile manner. One form of dielectric storage material is a triple layer dielectric formed of silicon oxide, silicon nitride and silicon oxide (ONO). The dielectric is typically sandwiched between a conductive control gate and the semiconductor substrate above the memory cell channel. Various NOR and NAND arrays using dielectric charge storage are described in U.S. patent application publication no. 2003/0109093A1. Transferring electrons from the cell channel into the nitride, where they are trapped and stored in a limited area, programs dielectric storage cells.

Another alternative to floating gate memories and to dielectric storage memories is a technique of embedding very small conducting regions within the gate oxide to store trapped electrons, commonly called nanocrystal memories. As described in U.S. Pat. Nos. 6,656,792 and 6,090,666 and U.S. patent application publication no. 2004/0130941, these nano-crystalline sites are deposited in place of a conductive floating gate, being separated from the substrate by a tunneling oxide and being separated from the control gate by another insulator. The nanocrystals can be of a variety of materials including silicon, germanium, or various metals. They are typically of such small sizes and spatially isolated from each other such that there are a multitude of these nanocrystal regions covering the entire conductive channel region between source and drain.

The various programming techniques mentioned above may also be used with memory cells employing non-conductive dielectric charge-trapping devices or nanocrystals in place of conductive floating gates. Common erase techniques are also be used.

SUMMARY OF THE INVENTION

It is desirable to program the memory cells with data by use of voltages that are as low as possible in order to avoid disturbing the level of charge stored in memory cells adjacent those being-programmed. It is also desired to minimize the amount of current required to program individual memory cells, thereby to reduce the demand on power supply circuits and/or to increase the number of memory cells that can be programmed in parallel with a given level of current. It is further desired to program the memory cells very quickly. Increased programming speed and parallelism directly improve the performance of the memory system by reducing the amount of time required to program a given amount of data into the memory.

These goals are reached by the substrate hot electron injection techniques of the present invention, wherein, generally, memory cells to be programmed by applying a programming voltage to a control gate thereof have their sources and drains electrically floating while others of the memory cells also receiving the programming voltage on their control gates are inhibited from being programmed by applying a voltage to at least one of their source and drain. This technique is particularly useful to program some and inhibit others of a plurality of memory cells in a row of memory cells that share a common word or other control gate line. The memory cells being inhibited from programming may also have the voltages applied to their source and/or drain varied in time in a manner to boost the voltage of the memory cell substrate in synchronism with programming voltage pulses so that the voltage across a dielectric layer positioned between the substrate and the charge storage element is kept low enough for the programming to take place.

Additional aspects, advantages, features and implementing details of the present invention are included in the following description of exemplary examples thereof, which description should be taken in conjunction with the accompanying drawings.

BRIEF DESCRIPTION OF THE DRAWINGS

FIG. 1 is a cross-section through a memory cell array formed on a semiconductor substrate that schematically illustrates simultaneously programming one cell and inhibiting the programming of another cell when control gates of both cells are connected to a common control gate line voltage;

FIG. 2 is an energy band diagram through section A—A of memory cell A of FIG. 1;

FIGS. 3A and 3B are energy band diagrams through section B—B of memory cell B of FIG. 1 under different operating conditions;

FIG. 4 is a voltage timing diagram showing an example operation of the memory cells of FIG. 1, including voltage curves (A) and (B);

FIG. 5 is a block diagram of a first example flash memory system;

FIG. 6 illustrates a representative portion of the memory cell array of the system of FIG. 5 that has a NAND architecture;

FIG. 7 is a cross-sectional view, along a NAND memory cell column string of FIG. 6, of its semiconductor integrated circuit structure;

FIG. 8 is another cross-section view of the memory array of FIG. 6, taken at section 8—8 of FIG. 7;

FIG. 9 is a further cross-section view of the memory array of FIG. 6, taken at section 9—9 of FIG. 7;

FIG. 10 illustrates operation of the memory system of FIGS. 5–9 to program selected memory cells thereof;

FIG. 11 is a block diagram of a second example flash memory system;

FIG. 12 is a plan view of a portion of the memory cell array of the system of FIG. 11 that has a NOR architecture; and FIG. 13 is a cross-sectional view of the memory cell array of FIG. 12, taken along section 13—13 thereof.

DETAILED DESCRIPTION OF EXEMPLARY EMBODIMENTS

The programming principles of the present invention are generally described with respect to FIGS. 1–4, a first application thereof in a memory system with a NAND memory array is described with respect to FIGS. 5–10, and a second application thereof to a NOR memory array described with respect to FIGS. 11–13.

Substrate Hot Electron Injection Programming Techniques

Two memory cells A and B are shown in cross-section in FIG. 1 in a manner that illustrates the substrate hot electron injection programming techniques of the present invention. The two cells are formed on a common silicon substrate. A base or interior layer 1 has n-type conductivity doping. A well 2 adjacent a surface 3 of the substrate has p-type conductivity doping and therefore forms a p-n junction 4 within the substrate. Both of the memory cells A and B are formed in the well 2 and each have the same structure. Source and drain regions 5 and 6, with n+doping, are spaced apart across the substrate surface 3 with a channel region 7 therebetween. A conductive floating gate 8 extends completely across the channel 7 in this example but may alternatively extend only part way across the channel with another gate or gates positioned over the remaining portion of the channel. Preferably a p type doping 19 with concentration higher than that of the p-well 2 is placed locally around the source and drain regions as described below.

A thin layer 9 of oxide is typically grown by thermal oxidation on the surface 3 of the substrate to serve as the gate dielectric. The layer 9 is sandwiched between the floating gate 8 and the substrate surface 3. A dielectric 10 formed over the floating gate 8 is typically a three-layer oxide-nitride-oxide (ONO) structure or another type of dielectric, preferably with a high dielectric constant. A conductor 11, elongated in a direction across FIG. 1, extends across both of the memory cells A and B. Portions of the conductor 11 positioned over the floating gates 8 serve as the control gates for the memory cells. A voltage $V_{CG}$ applied to the line 11 is thus coupled with the floating gates 8 of both cells through these control gates, and in turn a portion of this voltage is coupled with the substrate channels 7 the memory cells according to their individual coupling ratios. The line 11 is most commonly one of a large number of word lines of a typical memory cell array but may alternatively be some other type of control gate in other types of arrays. The floating gates 8 and the conductive line 11 are typically made of conductively doped polysilicon material.

The memory cells coupled with the line 11 are preferably programmed from their erased state by applying a succession of programming voltage $V_{CG}$ pulses to the conductor 11, with read-verification of the states of the individual cells taking place in between the programming pulses. The voltage of each programming pulse is typically made to have a magnitude that is a small amount greater than the magnitude of the last pulse. When a cell is verified to have reached its desired programmed state, it is inhibited from further programming while programming pulses continue to be applied to the line 11 to program others of the memory cells. When all the cells along the line 11 are verified to be programmed to their intended states, the programming operation is then ended. This portion of the programming algorithm for the memory cells of FIG. 1 is commonly used in commercial flash memories, and is described more fully in many of the references cited in the Background section above.

However, the present invention utilizes a different programming mechanism from those of the prior techniques. The primary difference in implementation is the manner in which the individual memory cells along the line 11 are controlled to either be programmed or inhibited from being programming during application of these programming pulses. In order to show an example of each, the conditions shown in FIG. 1 have been chosen to illustrate the memory cell A being programmed during one of the programming pulses and the memory cell B at the same time being inhibited from being programmed. The programming of memory cell B may be inhibited because it has reached its programmed state while memory cell A has not. Or, if the memory system recognizes the erased state of the memory cells as one of the programmed states, programming may be inhibited because memory cell B is not to be programmed at all. Programming is accomplished by injecting electrons with high enough energy from the substrate 2 through the dielectric layer 9 onto the floating gate 8. These electrons need to be generated and accelerated toward the surface 3.

To be programmed, memory cell A has its source and drain regions 5 and 6 floating. That is, they remain unconnected with any power supply voltage or ground potential external of the memory cells. Electrons are then caused to be injected onto the floating gate 8 of memory cell A in response to the programming $V_{CG}$ pulses. One or both of the source and drain regions 6 and 7 of memory cell B, on the other hand, are connected with ground potential, in one specific embodiment, which then prevents electrons from being injected onto its floating gate 8 during the same programming pulses. This programming technique has a significant advantage that it is easily implemented in memory cell arrays of various architectures, two examples of which are described below. The injection efficiency of the energetic electrons is high and as a result the current required for programming is reduced by use of this technique and the speed of programming is increased.

The source of electrons for programming memory cell A is the p-n junction 4 within the substrate. The programming pulse $V_{CG}$ applied to the control gate of memory cell A through the line 11 causes the cell to operate in a deep depletion mode during a portion of the pulse. When in such a mode and the programming pulse voltage $V_{CG}$ is high enough, the depletion region 12 has punched through the well 2 to the p-n junction 4. This causes the p-n junction 4 to be forward biased and therefore supply electrons to the depletion region 12. An electric field is created within the depletion region 12 by the voltage on the floating gate 8 that is induced from the voltage on the control gate line 11. This field causes the injected electrons to be accelerated to the surface 3 and some proportion of them to have sufficient energy to be injected through the dielectric 9 and onto the floating gate 8. At the end of the programming pulse $V_{CG}$, the depletion region 12 contracts within the well 2, with the result that the p-n junction 4 no longer supplies electrons, at least not in the numbers necessary for programming.

FIG. 2 shows an energy band diagram through section A—A of FIG. 1 during programming. A line 111 indicates the Fermi energy level of the control gate 11 when $V_{CG}$ is applied to it with Vsub grounded. For simplicity, the ONO region 110 is shown as having a single energy level in the band diagram, but in actuality it would have regions of different energy gaps corresponding to the materials composing this region. The floating gate potential is represented by line 108 and line 107 represents the surface potential in the p-well near the gate-oxide p-well surface (surface 7, memory cell A of FIG. 1). It is seen that there is a voltage drop across the ONO (dielectric 10, memory cell A of FIG. 1), gate oxide (gate dielectric 9, memory cell A of FIG. 1), and also a voltage drop across the p-well. The line 102/101 of FIG. 2 represents the p-well to n-substrate junction. The quasi-Fermi level of the n-substrate is shown higher than that of the p-well, but the electric field from the control gate depleting through the p-well causes this junction to be slightly forward biased, providing a source of electrons. The electrons injected from the p-n junction 4 into region 2 have a higher potential energy than that of an oxide barrier 107a, and some are able to pass over this barrier and be trapped in the potential well 108 of the floating gate (floating gate 8, memory cell A of FIG. 1).

The voltages Vw and Vsub applied to the well 2 and substrate region 1 respectively are preferably connected together and set to a value sufficient to avoid forward biasing the p-n junction 4 since to do so would supply electrons for all of the cells formed in the well 2. An advantage of the programming technique being described is that the forward bias of the p-n junction 4 is selectively controlled for each memory cell, even though they are formed within the common well 2. Electrons are supplied to an individual memory cell for its programming by allowing its source and drain regions to float during at least a portion of the programming pulse VCG, thereby to generate electrons while the cell is in its resulting deep depletion mode. It is unnecessary to form a separate buried p-n junction in each cell. It is further unnecessary to provide a separate p-n junction for each cell that is isolated from the others, wherein the voltage across the junction of each cell would be separately controlled from the outside of the cell. The programming technique being described is quite compatible with an array of memory cells formed by a typical double or triple well CMOS process.

In order to inhibit programming of a memory cell, as illustrated for the memory cell B in FIG. 1, at least one of its source and drain regions 5 and 6 is connected with some external voltage such as ground potential. Charge is not injected onto the floating gate 8 of the memory cell B under these conditions. This is the result of a voltage on at least one of the source and drain regions causing the channel 7 to become inverted, as shown, and this in turn prevents a depletion region 13 within the well 2 from reaching the p-n junction 4. Without the p-n junction 4 being forward biased to provide electrons for injection onto the floating gate 8, programming does not occur. Any difference in the voltages on the source and drain regions 5 and 6 of memory cell B is minimized in order to avoid inadvertently causing programming by some other mechanism such as channel hot-electron injection from the channel 7.

FIG. 3A shows an energy band diagram through section B—B of FIG. 1 when programming is inhibited. In this case, the channel 7 of memory cell B under the floating gate 8 is inverted and has become n-type because source junction 6 is connected to a potential lower than the control gate voltage and is able to supply electrons in response to the field from the control gate. If the voltage Vs of the source 6 is chosen to be equal to the voltage Vsub of the substrate 1, this inversion region then shields the p-well —n-substrate junction and this junction does not become forward biased. It is observed that the entire control gate voltage is then dropped across the ONO-FG-Gate Oxide region. The resulting potential of the floating gate must be low enough such that the resulting field will not be sufficient to cause Fowler-Nordheim tunneling into the floating gate across the oxide 9 which would result in adding charge to a cell that should be inhibited.

FIG. 3B shows an energy band diagram through section B—B of the memory cell B of FIG. 1 when programming is inhibited, but in this case the source voltage Vs is greater than 0, typically by a few volts. This causes the depletion region to extend through the p-well but it does not reach the p-well—n-substrate junction. The depth of the depletion region depends on the voltage $V_s$ and the doping in region 2. Nevertheless, the net voltage across the floating gate oxide 9 is reduced relative to that of FIG. 3A.

The deep-depletion bias condition illustrated for memory cell A and by FIG. 2 can only exist on a transient basis. Some of the electrons reaching the surface will accumulate under the surface and create an inversion region. This induced inversion region screens the substrate, terminating the field lines from the floating gate. The depletion region collapses and the energy band diagram resembles the one shown in FIG. 3B.

The enhanced p type doping 19 under the source and drain is introduced to prevent the source or drain region from depleting through the p-well 2 and causing electron injection in these regions when the selected cell should be inhibited. The effect is to locally increase the well doping in these regions so that the maximum depletion depth will be safely away from the injecting junction 4. It is shown completely surrounding the source and drain junctions, and can be easily introduced at the same time these junctions are formed. However, it is only necessary that it be situated between the source or drain and the n type region 1, and alternate fabrication techniques such as ion implantation can be employed to confine the increased doping to these narrower regions.

Although the p-well 2 as described may be formed as in a conventional CMOS process, the programming injection efficiency can be enhanced if the doping profile is tailored to favor injection. This can be accomplished by placing the peak doping concentration somewhat below the silicon surface 3 with the result that the electric field will be high toward the surface and favorably accelerate the injected electrons toward the floating gate, minimizing their opportunity to scatter and lose energy and maximizing their ability to be injected over the oxide-silicon interface 3.

A major advantage of the new programming technique being described is that the control gate programming voltage $V_{CG}$ need not be as high as it is when other techniques are used. This results from an increased coupling ratio being created when operating in the deep depletion mode, the case for memory cell A of FIG. 1. Another way to visualize this increase in coupling ratio is to think in terms of how well the control gate controls the potential of the floating gate. If they are tightly coupled, a high fraction of the voltage on the control gate appears on the floating gate; if they are loosely coupled, the voltage on the floating gate is closer to ground. This effect is often expressed as a coupling ratio, defined as the capacitance between the control gate and floating gate divided by the total capacitance from the floating gate to all other nodes. When the floating gate capacitance to ground is low, the coupling ratio is high and the floating gate potential is relatively high. For memory cell A of FIG. 1 (being programmed), the capacitance to ground is very low because the gate oxide capacitance is in series with the much smaller deep depletion layer capacitance between the surface and substrate. For memory cell B of FIG. 1 (being inhibited), the capacitance to ground is high, being the gate oxide capacitance since the channel is conductive and the source is at ground. The floating gate has a lower fraction of the control gate voltage.

However, the voltage $V_{CG}$ can be high enough in certain cases to raise a risk of inadvertently programming the memory cell B. This is possible because of the very thin gate oxide layer 9 and a limited voltage stress that it can withstand before it conducts. If the voltage between the substrate channel 7 and the floating gate 8 exceeds what the intermediate oxide layer 9 can withstand, electrons move through the oxide as a result. Since the voltage of the channel 7 is controlled by the external voltage applied to the source and/or drain regions 5 and 6 of memory cell B, placing one or both of them at ground potential could result in a high field across the gate oxide layer 9. Whether this could raise a risk of inadvertent programming or not depends on the maximum level of $V_{CG}$, the thickness of the dielectric layer 9 and its dielectric constant.

Where there is this risk, the voltage of the channel region 7 of memory cell B can be biased from an external power supply or boosted in a controlled manner during the individual programming pulses applied to the control gate line 11. Biasing the source or drain from an external power supply is straightforward although is not always practical, and boosting the channel region 7 is a preferred embodiment. Referring to FIG. 4, curve (A) shows an example of a programming pulse applied to the conductive line 11 of FIG. 1, expanded in time scale in order to clearly show its leading edge 14. Curve (B) of FIG. 4, illustrates a voltage function that is simultaneously applied to the drain 5 of memory cell B instead of maintaining the drain at ground or some other fixed potential. At time t2, after the leading edge of the programming pulse (A) has reached some predetermined voltage 15, a voltage pulse (B) is initiated on the drain 5. The rise time of the pulse of $V_D$ is likely much less than that of the pulse of $V_{CG}$ because of a lower amount of capacitance being driven.

The result is that between times t1 and t2, the voltage across the dielectric layer 9 of memory cell B increases but that increase is capped by increasing the voltage on the drain beginning at time t2. That is, instead of the voltage across the dielectric layer 9 reaching the maximum $V_{CG}$ during the programming pulse, it is capped at a value of a difference between the maximum voltages $V_{CG}$ and $V_D$, where $V_{CG}$ is the voltage on the control gate 11 of FIG. 1 and $V_D$ is the voltage on the drain junction 5. In the case of programming memory cells of a NAND array, described hereinafter, the voltage across the dielectric layer can be reduced even further through channel boosting. This significantly reduces the potential for any programming of memory cell B to take place due to conduction of the dielectric layer 9. The same result may be obtained with other voltage functions than that shown as curve (B) of FIG. 4, such as one with a voltage VD that gradually increases between times t1 and t2 with a rate of rise that is less than that of the leading edge 14 of the programming pulse.

Another advantage of the programming technique being described is that programming of cell A (FIG. 1) can be made to be self-limiting. As charge builds up on the floating gate 8, that negative charge counteracts the effect of the positive programming voltage on the control line 11 that is coupled with the floating gate 8. When the stored charge becomes sufficient for a particular voltage applied to the control line 11, the depletion region 12 withdraws from the p-n junction 4, which therefore ceases to supply the high quantity of electrons for programming.

It may also be noted that the selective programming and inhibiting of the memory cells A and B occur at the same time without the need to first condition the memory cells to be inhibited before the programming pulse is applied.

Although the example memory cells of FIG. 1 utilize floating gates 8, the cells may instead use a dielectric charge trapping material. The use of dielectric charge storage elements has already been discussed generally in the Background above. The floating gate 8 of FIG. 1 would be omitted and such a dielectric sandwiched between the substrate surface 3 and the conductor 11 in at least the channel regions 7. The dielectric may by a three layer ONO where the charge is trapped in the middle nitride layer. Charge is likely stored substantially uniformly along the charge trapping dielectric along the channel region 7, rather than in only specific regions thereof as will occur with other programming techniques. Alternately nano-crystals may be used in place of a dielectric charge trapping material.

Although the n-region 1 serving as the source of electrons for programming memory cell A is shown and described in FIG. 1 as the substrate, it may also be an n-well contained within a p-substrate. This is particularly advantageous in the NAND system implementation described below in which this same n-region is isolated from the p-substrate during the erase cycle. Typically, a high positive voltage is applied to the n-region and electrons are removed from the floating gate or dielectric storage region by Fowler-Nordheim tunneling. The use of an isolated n-well separate from the p substrate facilitates construction of CMOS decoding circuitry in the periphery of the chip.

Also, a portion or the entire thickness of the layers 1 and 2 of FIG. 1 can alternatively be formed in an epitaxial layer, preferably a selective epitaxial layer that is formed over selected portions of the substrate.

Further, doping within the n-doped layer 1 may be increased adjacent the p-n junction 4 in order to enhance the injection of electrons. This increased doping can be accomplished by an implantation through the layer 2 of ions that is non-uniform as a function of depth within the structure.

The programming techniques described with respect to FIG. 1 can also be used to store multiple states, and thus more than one bit of data, on each charge storage element, whether it is a floating gate or charge trapping dielectric. In that case, charge is stored on the charge storage element within more than two ranges that each indicate one storage state of the element. Four such ranges, or three ranges plus the erased state, are typically used, resulting in storing two bits of data in each charge storage element.

Utilization in a NAND Array

With reference to FIGS. 5–9, a specific non-volatile memory system is described in which the various aspects of the present invention are implemented, in order to provide specific examples. FIG. 5 is a block diagram of a flash memory system. Memory cell array 21 includes a plurality of memory cells M arranged in a matrix controlled by a column control circuit 22, a row control circuit 23, a c-source control circuit 24 and a c-p-well control circuit 25. The column control circuit 22 is connected to bit lines (BL) of the memory cell array 21 for reading data stored in the memory cells (M), for determining a state of the memory cells (M) during a program operation, and for controlling potential levels of the bit lines (BL) to promote the programming or to inhibit the programming. The row control circuit 23 is connected to word lines (WL) to select one of the word lines (WL), to apply read voltages, to apply program voltages combined with the bit line potential levels controlled by the column control circuit 22, and to apply an erase voltage coupled with a voltage of a p-type region (labeled as "c-p-well" 31 in FIG. 7) on which the memory cells (M) are formed. The c-source control circuit 24 controls a common source line (labeled as "c-source" in FIG. 6) connected to the memory cells (M). The c-p-well control circuit 25 controls the c-p-well voltage.

The data stored in the memory cells (M) are read out by the column control circuit 22 and are output to external I/O lines via an I/O line and a data input/output buffer 26. Program data to be stored in the memory cells are input to the data input/output buffer 26, via the external I/O lines, and transferred to the column control circuit 22. The external I/O lines are connected to a controller 40.

Command data for controlling the flash memory device are input to a command interface connected to external control lines that are connected with the controller 40. The command data informs the flash memory of what operation is requested. The input command is transferred to a state machine 28 that controls the column control circuit 22, the row control circuit 23, the c-source control circuit 4, the c-p-well control circuit 25 and the data input/output buffer 26. The state machine 28 outputs status data of the flash memory.

The controller 40 is connected or connectable with a host system such as a personal computer, a digital camera, and a personal digital assistant. It is the host that initiates commands, such as to store or read data to or from the memory array 21, and provides or receives such data. The controller 40 converts such commands into command signals that can be interpreted and executed by the command circuits 27. The controller also typically contains buffer memory for the user data being written to or read from the memory array. A typical memory system includes one integrated circuit chip 41 that includes the controller 40, and one or more integrated circuit chips 42 that each contain a memory array and associated control, input/output and state machine circuits. The trend is to integrate the memory array and controller circuits of a system together on one or more integrated circuit chips. The memory system may be embedded as part of the host system, or may be included in a memory card that is removably insertable into a mating socket of host systems.

Such a card usually contains the entire memory system. Alternately, however, the controller and memory array may be provided in separate cards that are removably attached with each other. In such a case, the memory card contains the associated peripheral circuits illustrated in FIG. 5 to the right of the dashed line.

With reference to FIG. 6, an example structure of the memory cell array 21 is described. A memory cell array of a NAND type is described. The memory cells (M) are partitioned into 1,024 blocks, in a specific example. The data stored in each block are simultaneously erased. The block is thus the minimum unit of a number of cells that are simultaneously erasable. In each block, in this example, there are 8,512 columns that are divided into even columns and odd columns. The bit lines are also divided into even bit lines (BLe) and odd bit lines (BLo). Four memory cells coupled with each of the word lines (WL0 to WL3) at their floating gates are connected in series to form a NAND cell unit string. One terminal of the NAND cell unit is connected to corresponding bit line (BL) via a first select transistor (S) which gate electrode is coupled to a first select gate line (SGD), and another terminal is connected to the c-source via a second select transistor (S) which gate electrode is coupled to a second select gate line (SGS). Although four floating gate transistors are shown to be included in each cell unit, for simplicity, a higher number of transistors, such as 8, 16 or even 32, are more typically used.

During a user data read and programming operation, 4,256 cells (M) are simultaneously selected, in this specific example. The cells (M) selected have the same word line (WL), for example WL2, and the same kind of bit line (BL), for example the even bit lines BLe0 to BLe4255. Therefore, 532 bytes of data can be read or programmed simultaneously. These 532 bytes of data simultaneously read or programmed forms a logical page. Therefore, one block can store at least eight logical pages. When each memory cell (M) stores two bits of data, namely a multi-level cell, one block stores 16 pages. The number of memory cells in a row along each word line can further be increased in order to store two or more logical pages of data when the charge storage elements of the memory cells each store one bit of data, and more with multi-state operation. In another embodiment as described in U.S. patent application publication no. 2004/0057283, a group of adjacent bit lines are programmed together rather than every other bit line as described above.

FIG. 7 shows a cross sectional view of a NAND cell unit of the type shown schematically in FIG. 6, in the direction of the bit line (BL), along two series strings of memory cell units connected between the bit line BL and the C-source line. At a surface of a p-type semiconductor substrate 29, a p-type region c-p-well 31 is formed, the c-p-well being enclosed by an n-type region 30 to electrically isolate the c-p-well from the p-type substrate 29. The n-type region 30 is connected to a c-p-well line made of a first metal M0 via a first contact hole (CB) and an n-type diffusion layer interface. The p-type region c-p-well 31 is also connected to the c-p-well line via the first contact hole (CB) and a p-type diffusion layer interface. The c-p-well line is connected to the c-p-well control circuit 25 (FIG. 5).

Each memory cell has a floating gate (FG) that stores an amount of electric charge corresponding to the data being stored in the cell, the word line (WL) forming the gate electrode, and drain and source regions 32 of an n-type conductivity. The floating gate (FG) is formed on the surface of the c-p-well via a gate oxide film 34. The word line (WL) is stacked on the floating gate (FG) via an insulator film 35 {34 & 35 need to be added to FIG. 7}. The source electrode is connected to the common source line (c-source) made of the first metal (M0) via the second select transistor (S) and the first contact hole (CB). The common source line is connected to the c-source control circuit 24 of FIG. 5. The drain electrode is connected to the bit line (BL) made of a second metal (M1) via the first select transistor (S), the first contact hole (CB), an intermediate wiring of the first metal (M0) and a second contact hole (V 1). The bit line is connected to the column control circuit 22.

FIGS. 8 and 9 show cross sectional views of a memory cell (section 8—8 of FIG. 7) and a select transistor (section 9—9 of FIG. 7), respectively, in the direction of the word line (WL2). Each column is isolated from the neighbor columns by a trench formed in the substrate and filled with isolation material, known as shallow trench isolation (STI). The floating gates (FG) are isolated from each other by the STI, the word line (WL) and intermediate dielectric layer 35. Since the gate electrode (SG) of the select transistor (S) is formed in the same formation process steps as the floating gate (FG) and word line (WL), it shows a stacked gate structure. These two select gate lines (SG) are connected together at their ends (not shown). Alternately, they may be connected together locally within the array using an additional masking operation to selectively remove the insulator separating them.

Referring to FIG. 10, two of the series connected NAND memory cell strings of FIG. 6 are shown being operated as described above with respect to FIGS. 1–4. In this example, memory cell A in one of the strings is being programmed while memory cell B along the same word line WL2 in another one of the strings is inhibited from being programmed. In a specific NAND array, its memory cells are programmed in order, first those in the row along word line WL0 adjacent the source connection and then one row at a time in sequence, the row along WL1, then WL2, then along WL3, etc. In this example, the memory cells A and B are along word line WL2, which means that the memory cells along word lines WL0 and WL1 have already been programmed and those along word line WL3 remain erased. A voltage is applied to bit line BL0 to allow the programming of memory cell A when a programming voltage is applied to the word line WL2. A voltage is applied to bit line BL1 to inhibit programming of memory cell B while WL2 is being driven with the programming voltage. The C-source line is typically held at ground potential or slightly positive to minimize the possibility of leakage or breakdown between the channel and the C-source line. In other embodiments the order of programming word lines may differ. One approach is to program WL0, then WL2, then WL1, and continue alternating in this manner.

Programming of the memory cell A of FIG. 10 takes place with its source and drain regions floating, as described above with respect to FIG. 1. Drain side switching transistor 44 and source side switching transistor 45 of the string including memory cell A are therefore rendered non-conductive (switched off) during programming. Drain side switching transistor 44 is rendered non-conductive even though it may have 3 volts, for example, on its gate because 3 volts is also applied to the bit line BL0. Source side switching transistor 45 is rendered non-conductive because 0 volts is applied to its gate. The source and drain regions of the entire string of memory cells between switching transistors 44 and 45 are therefore floating.

In order to inhibit programming of memory cell B of FIG. 10, drain side switching transistor 46 of the string containing memory cell B is at the same time rendered conductive (turned on) by applying a different voltage to its bit line BL1 than applied to the bit line BL0. If BL1 is held at ground potential, for example, and the intermediate word lines (in this case only WL3) are held at ground, the drain of memory cell B will be at ground potential. Even though the memory cell along WL3 that is adjacent memory cell B is turned off, it will pass zero volts from the switching transistor 47 to the drain of memory cell B because it has not yet been programmed, so is in the erased state with a negative threshold.

As described above, primarily with respect to FIG. 4, rather than holding the drain of memory cell B at ground potential during the entire cycle of programming memory cell A, it may be preferable to do so during only an initial portion of the rise time of each programming pulse and then switch the drain voltage to some positive voltage. This may be carried out by initially holding the voltage of BL1 at ground and then raising it to the same voltage as BL0 but at time t2 of FIG. 4. As $V_{CG}$ continues to rise in voltage, the channel potential under the word line (and the associated source and drain regions) also rises with it, thereby reducing the net field across the gate oxide. At a time shortly after t2 when the drain voltage reaches the voltage on the select gate (less the threshold voltage of the select gate transistor), the select gate will cut off the channel, the channel will float, and the channel potential will rise as the control gate continues to rise. Although this causes depletion into the p-well, the remaining voltage rise is not sufficient to cause the depletion to reach the n-substrate p-well junction (p-n junction 4 of FIG. 1) and inject electrons onto the floating gate. Depending on the magnitude of the remaining rise in the control gate voltage, the resulting field across the floating gate oxide can be less than that obtained in the structure of FIG. 1 in which $V_D$ is applied directly to the channel.

Utilization in a NOR Array

An example memory system incorporating the various aspects of the present invention is generally illustrated in the block diagram of FIG. 11. A large number of individually addressable memory cells 51 are arranged in a regular array of rows and columns, although other physical arrangements of cells are certainly possible. Bit lines, designated herein to extend along columns of the array 51 of cells, are electrically connected with a bit line decoder and driver circuit 53 through lines 55. Word lines, which are designated in this description to extend along rows of the array 51 of cells, are electrically connected through lines 57 to a word line decoder and driver circuit 59. Select gates, connecting lines of which extend along columns of memory cells in the array 51, are electrically connected to a select gate line decoder and driver circuit 61 through lines 63. Each of the decoders 53, 59 and 61 receives memory cell addresses over a bus 65 from a memory controller 67. The decoder and driving circuits are also connected to the controller 67 over respective control and status signal lines 69, 71 and 73.

The controller 67 is connectable through lines 75 to a host device (not shown). The host may be a personal computer, notebook computer, digital camera, audio player, various other hand held electronic devices, and the like. The memory system of FIG. 11 will commonly be implemented in a card according to one of several existing physical and electrical standards, such as one from the PCMCIA, the Compact-Flash™ Association, the MMC™ Association, the Secure Digital (SD) Card Association, and others. When in a card format, the lines 75 terminate in a connector on the card that interfaces with a complementary connector of the host device. The electrical interface of many cards follows the ATA standard, wherein the memory system appears to the host as if it was a magnetic disk drive. Other memory card interface standards also exist. Alternatively, a memory system of the type shown in FIG. 11 may be embedded in the host device.

The decoder and driver circuits 53, 59 and 61 generate appropriate voltages in their respective lines of the array 51, as addressed over the bus 65, according to control signals in respective control and status lines 69, 71 and 73, to execute programming, reading and erasing functions. Any status signals, including voltage levels and other array parameters, are provided by the array 51 to the controller 67 over the same control and status lines 69, 71 and 73. A plurality of sense amplifiers within the circuits 53 receive current or voltage levels that are indicative of the states of addressed memory cells within the array 51, and provides the controller 67 with information about those states over lines 81 during a read operation. A large number of sense amplifiers are usually used in order to be able to read the states of a large number of memory cells in parallel. During reading and program operations, one row of cells is typically addressed at a time through the circuits 59 for accessing a number of cells in the addressed row that are selected by the circuits 53 and 61. During an erase operation, all cells in each of many rows are typically addressed together as a block for simultaneous erasure.

A few memory cells of an exemplary array 51 are shown in FIGS. 12 and 13, including two memory cells A and B that are being programmed and inhibited, respectively, in the same manner as memory cells A and B shown in FIG. 1. Source and drain diffusions 85–87 are formed within a common semiconductor well 89 having p-type conductivity, and are elongated in the column direction and spaced apart in the row direction. Floating gates, shown in cross-section, extend partially across channels of the memory cells between their source and drain regions. Conductive select gate lines SG1, SG2 and SG3 are also elongated in the column direction and spaced apart in the row direction over the remaining portions of the channel regions. This forms a select transistor in series with a floating gate transistor between adjacent source and drain regions of a memory cell. Dielectric layers (not shown) are positioned between the substrate and the floating and select gates. Conductive word lines WL1, WL2 and WL3, elongated in the row direction and spaced apart in the column direction, extend over the floating and select gates with dielectric layers therebetween.

During programming, a voltage is applied to the select gate lines SG1, SG2 and SG3 of the array to maintain the memory cell channel regions under them in a non-conductive state. That is, the select transistors of the individual memory cells are turned off. Connection of the select gate lines to ground potential will normally accomplish this. The drain region 86 of memory cell A being programmed is allowed to float. A programming voltage is applied to the word line WL2, typically a series of programming pulses, that operates memory cell A in deep depletion, as already described with respect to FIG. 1.

For memory cell B, which is being inhibited from being programmed by the relatively high voltage on the word line WL2, a voltage is simultaneously applied to its source/drain region 87, which allows creation of an inversion region in the channel under the floating gate. The operation of this has already been described with respect to FIG. 1. The voltage applied to the source/drain region 87 may also be in accordance with curve (B) of FIG. 4, as described above.

Of course, it is preferable to simultaneously program as many memory cells along an entire row or word line as possible. This results in many memory cells along a row being programmed at the same time, in the manner of memory cell A. Others of the memory cells of the row will not be programmed at all if the erased state is also identified by the system as one of the programmed states. These cells are inhibited like memory cell B from being programmed. Yet others of the cells of the row will be programmed but inhibited like memory cell B when they reach their programmed states, while the programming of other cells of the row continues. When all of the cells along the row have been inhibited because they have all reached their programmed charge levels, then the programming operation for that row is completed.

CONCLUSION

Although the various aspects of the present invention have been described with respect to exemplary embodiments thereof, it will be understood that the present invention is entitled to protection within the full scope of the appended claims.

What is claimed is:

1. A method of selectively programming a plurality of memory cells coupled with a common control gate line, wherein the memory cells are formed within a semiconductor well of one conductivity type, individually have source and drain regions of an opposite conductivity type formed in a surface of the well with a channel region therebetween and a charge storage element positioned over at least a portion of the channel, the well being formed in a semiconductor region of the opposite conductivity type, comprising simultaneously:

applying a programming voltage to the common control gate line, programming at least some of the plurality of memory cells along the control gate line by allowing their source and drain regions to float electrically, and inhibiting the programming of others of the plurality of memory cells along the control gate line by applying voltages to at least one of their source and drain regions.

2. The method of claim 1, wherein inhibiting the programming of others of the plurality of memory cells includes applying a potential to at least one of their source and drain regions.

3. The method of claim 1, wherein applying a programming voltage includes applying a series of voltage pulses to the common control gate line, and wherein inhibiting the programming of others of the plurality of memory cells includes applying a voltage to at least one of their source and drain regions that increases during a rise time of the individual voltage pulses.

4. The method of claim 3, wherein applying a voltage includes applying a potential to at least one of their source and drain regions for a portion of a rise time of individual voltage pulses followed by a stepped increased voltage during a remaining portion of the rise time.

5. The method of claim 1, wherein the common control gate line is one of a plurality of word lines of an array of memory cells according to a NAND architecture.

6. The method of claim 1, wherein the common control gate line is one of a plurality of word lines of an array of memory cells according to a NOR architecture.

7. The method of claim 1, wherein applying a programming voltage to the common control gate line includes doing so in a manner that said at least some of the plurality of memory cells along the common control gate line are operated in a deep depletion mode under their channel regions in a manner to forward bias an interface of opposite conductivity types between the well and the semiconductor substrate to generate electrons for the deep depletion region.

8. The method of claim 1, wherein applying voltages to at least one of the source and drain regions of the others of the plurality of memory cells includes doing so in a manner that causes their channel regions to invert in conductivity type.

9. In an array of non-volatile memory cells formed in a semiconductor substrate well of a first conductivity type with charge storage elements positioned across a surface thereof between source and drain regions of a second conductivity type therein, the substrate well forming an interface within the substrate with semiconductor material of the second conductivity type, wherein the memory cells are arranged in a plurality of series connected strings with word lines extending across charge storage elements of memory cells in the plurality of strings, a method of selectively programming the memory cells of different strings along a common one of the word lines, comprising:

allowing the source and drain regions of a first group of the memory cells along the common one of the word lines to electrically float, applying a programming voltage to the common word line sufficient to cause charge to be injected from the substrate into the charge storage elements of the memory cells of the first group, and applying voltages to at least one of the source and drain regions of a second group of memory cells along the common word line sufficient to inhibit programming thereof during application of the programming voltage to the common word line.

10. The method of claim 9, wherein applying voltages to at least one of the source and drain regions of the second group of memory cells along the common word line includes applying a potential thereto through other memory cells of the individual strings of which the second group of memory cells are a part.

11. The method of claim 9, wherein applying a programming voltage includes applying successive voltage pulses to the common word line, and wherein applying a voltage to at least one of the source and drain regions of the second group of memory cells includes, during a rise time of the programming pulses, initially applying one potential thereto and then an increased positive voltage that is maintained during the pulse, wherein the voltage is applied to the second group of memory cells through other memory cells of the individual strings of which the second group of memory cells are a part.

* * * * *